US009871192B2

(12) United States Patent
Lee et al.

(10) Patent No.: US 9,871,192 B2
(45) Date of Patent: Jan. 16, 2018

(54) ELECTRONIC DEVICE

(71) Applicant: SK hynix Inc., Icheon-Si (KR)

(72) Inventors: Hyung-Suk Lee, Icheon-si (KR); Young-Ju Lee, Icheon-si (KR); Sook-Joo Kim, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/245,841

(22) Filed: Aug. 24, 2016

(65) Prior Publication Data

US 2017/0194558 A1 Jul. 6, 2017

(30) Foreign Application Priority Data

Dec. 30, 2015 (KR) .................. 10-2015-0189854

(51) Int. Cl.
G11C 11/00 (2006.01)
H01L 43/08 (2006.01)
G06F 3/06 (2006.01)
G06F 12/0802 (2016.01)
G06F 12/0831 (2016.01)
G11C 11/16 (2006.01)
H01L 43/02 (2006.01)
H01L 43/10 (2006.01)
H01L 43/12 (2006.01)

(52) U.S. Cl.
CPC ............ H01L 43/08 (2013.01); G06F 3/0611 (2013.01); G06F 3/0647 (2013.01); G06F 3/0656 (2013.01); G06F 3/0659 (2013.01); G06F 3/0685 (2013.01); G06F 12/0802 (2013.01); G06F 12/0831 (2013.01); G11C 11/161 (2013.01); H01L 43/02 (2013.01); H01L 43/10 (2013.01); H01L 43/12 (2013.01); G06F 2212/60 (2013.01); G06F 2212/621 (2013.01)

(58) Field of Classification Search
CPC .... G06F 3/0611; G06F 3/0647; G06F 3/0656; G06F 3/0659; G06F 3/0685
See application file for complete search history.

(56) References Cited

U.S. PATENT DOCUMENTS

| 8,959,250 | B2* | 2/2015 | Lee | .................. | H01L 43/08 |
| | | | | | 710/11 |
| 9,275,713 | B2* | 3/2016 | Guo | ................ | G11C 11/161 |
| 9,588,890 | B2* | 3/2017 | Kim | .................. | H01L 45/1253 |
| 9,634,246 | B2* | 4/2017 | Lee | .................. | H01L 45/08 |

FOREIGN PATENT DOCUMENTS

| KR | 10-2004-0038143 A | 5/2004 |
| KR | 10-2008-0061485 A | 7/2008 |

* cited by examiner

*Primary Examiner* — Pho M Luu
(74) *Attorney, Agent, or Firm* — Perkins Coie LLP

(57) ABSTRACT

An electronic device including a semiconductor memory is provided. The semiconductor memory may include an interlayer dielectric layer having a hole; a conductive pattern filled in the hole; and a variable resistance element coupled with the conductive pattern over the conductive pattern and storing different data according to a resistance change, wherein the conductive pattern includes a carbon-containing conductive layer in a region adjacent to the variable resistance element.

17 Claims, 9 Drawing Sheets

First planarization

ELECTRONIC DEVICE

CROSS-REFERENCE TO RELATED APPLICATION

This patent document claims priority of Korean Patent Application No. 10-2015-0189854, entitled "ELECTRONIC DEVICE AND METHOD FOR FABRICATING THE SAME" and filed on Dec. 30, 2015, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element and have a low level of difficulty.

In one aspect, an electronic device including a semiconductor memory may be provided to include an interlayer dielectric layer having a hole; a conductive pattern filled in the hole; and a variable resistance element coupled with the conductive pattern over the conductive pattern and storing different data according to a resistance change, wherein the conductive pattern includes a carbon-containing conductive layer in a region adjacent to the variable resistance element.

Implementations of the above electronic device may include one or more the following.

The conductive pattern includes a first conductive pattern, a second conductive pattern formed over the first conductive pattern, and the carbon-containing conductive layer formed over the second conductive pattern. The variable resistance element includes an MTJ (Magnetic Tunnel Junction) structure which includes a free layer having a variable magnetization direction, a pinned layer having a pinned magnetization direction and a tunnel barrier layer interposed between the free layer and the pinned layer, and the second conductive pattern and the carbon-containing conductive layer which are located under the MTJ structure. The hole includes a first hole, and a second hole positioned over the first hole and having sidewalls which are not aligned with the first hole, wherein the first conductive pattern is filled in the first hole, and wherein the second conductive pattern and the carbon-containing conductive layer are filled in the second hole. The carbon-containing conductive layer includes a carbon-containing metal layer. The carbon-containing conductive layer includes tantalum carbide. The variable resistance element includes an MTJ (Magnetic Tunnel Junction) structure which includes a free layer having a variable magnetization direction, a pinned layer having a pinned magnetization direction and a tunnel barrier layer interposed between the free layer and the pinned layer. The conductive pattern includes a first conductive material, and the carbon-containing conductive layer includes the first conductive material and carbon. The first conductive material has a specific resistance substantially same as that of the carbon-containing conductive layer. The first conductive material has Vickers hardness smaller than that of the carbon-containing conductive layer. The carbon-containing conductive layer has a bottom surface of which a center portion is dent compared to an edge. The carbon-containing conductive layer has a top surface which is substantially flat and located at a substantially same level as a top surface of the interlayer dielectric layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device may be provided to include forming a dielectric layer having a trench; forming a conductive layer by filling the trench with a conductive material; performing a first planarization process over a top of the conductive layer; forming a carbon-containing conductive layer by performing a carbon ion implantation process over the first planarized top; performing a second planarization process over the carbon-containing conductive layer to form a planarized surface; and subsequently forming a layered structure over the planarized surface of the carbon-containing conductive layer.

Implementations of the above method may include one or more the following.

The carbon ion implantation process may be performed over a whole surface of the conductive material and the dielectric layer. The carbon ion implantation process may be performed at an energy of about 1 KeV to about 30 KeV, and at a dose of about $1 \times 10^{13}$ atoms/cm3 to about $1 \times 10^{16}$ atoms/cm3. The first planarization process and the second planarization process may be performed by using the same slurry as each other. The carbon-containing conductive layer may include a material having a polishing rate different from that of the conductive layer. The carbon-containing conductive layer may include a material having Vickers hardness different from that of the conductive layer. The conductive material may include a metallic material. The conductive material may include tantalum (Ta). The layered structure formed over the planarized surface of the carbon-containing conductive layer includes a variable resistance element which is coupled with the carbon-containing conductive layer over the carbon-containing conductive layer and is structured to exhibit different resistance states for storing different data. The variable resistance element may include an MTJ (Magnetic Tunnel Junction) structure including a free layer having a variable magnetization direction, a pinned layer having a pinned magnetization direction and a tunnel barrier layer interposed between the free layer and the pinned layer.

These and other aspects, implementations and associated advantages are described in greater detail in the drawings, the description and the claims.

DETAILED DESCRIPTION

Figure 1A:
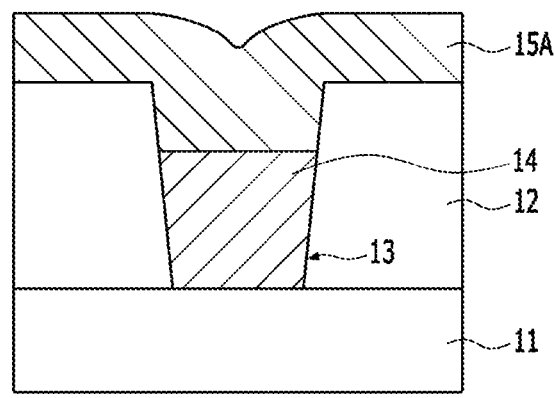
FIGS. 1A to 1E are cross-sectional views explaining a semiconductor device and a method for fabricating the same in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multilayer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to explaining drawings, a semiconductor device in accordance with an implementation of the present disclosure will be briefly described. The semiconductor device in accordance with the present implementation may include a variable resistance element which exhibits different resistance states and is capable of switching between the different resistance states in response to a voltage or current applied across the variable resistance element. Such a variable resistance element may store different data represented by the different resistance states and may function as part of a memory cell for data storage. as a particular example, the variable resistance element in accordance with the present implementation may include an MTJ (Magnetic Tunnel Junction) structure which includes a pinned layer including a magnetic material and having a pinned magnetization direction, a free layer including a magnetic material and having a variable magnetization direction, and a tunnel barrier layer interposed between the pinned layer and the free layer. In case that the magnetization directions of the pinned layer and the free layer of the MTJ structure are parallel to each other, the variable resistance element is in a low resistance state and may store, for example, data "0". Conversely, when the magnetization directions of the pinned layer and the free layer of the MTJ structure are anti-parallel to each other, the variable resistance element is in a high resistance state and may store, for example, data "1".

There are many requirements for satisfying certain characteristics required by the variable resistance element in various implementations. For example, it can be important to secure flatness of layers forming the MTJ structure. This is because various characteristics of the variable resistance element become deteriorated when a portion of the layers forming the MTJ structure exhibits flexure and may be distorted in shape. In the present implementation, it is intended to improve a structure disposed under the MTJ structure, thereby securing flatness of the MTJ structure and thus improving a characteristic of the variable resistance element.

FIGS. 1A to 1E are cross-sectional views explaining a semiconductor device and a method for fabricating the same in accordance with an implementation of the present disclosure.

First, the method for fabricating will be explained.

As shown in FIG. 1A, a substrate 11 may be provided to include a predetermined lower structure. Over the substrate 11, for example, an access element (not shown) for controlling the voltage or current supply to the variable resistance element may be formed. For example, a transistor, a diode, etc. may be used as the access element.

A contact hole 13 exposing a portion of the substrate 11, for example, an end of the access element formed over the substrate 11, may be formed by forming an interlayer dielectric layer 12 over the substrate 11 and then selectively etching the interlayer dielectric layer 12. Here, the interlayer dielectric layer 12 may be formed of various insulating materials such as silicon oxide, silicon nitride or a combination thereof, etc. The contact hole 13 may have a planar circular shape or a similar shape, or a shape in which a width of the cross section is decreased in a downward direction.

Next, a contact plug 14 is formed by filling a lower part of the contact hole 13 by depositing a conductive material having a thickness to sufficiently fill the contact hole 13 over a resultant structure having the contact hole 13 formed therein, and then performing an etch back process until the conductive material is lowered at a predetermined height than a top surface of the interlayer dielectric layer 12. The contact plug 14 is a passage for providing a current or voltage for the variable resistance element and is located under the variable resistance element. The contact plug 14 may have an upper end coupled with the variable resistance element and a lower end coupled with the access element of the substrate 11. The contact plug 14 may be formed of a metallic material such as Ti, W and the like, or a metal nitride such as TiN, WN, TaN and the like.

A conductive material 15A for a lower electrode of the variable resistance element may be formed in the remaining portion of the contact hole 13 having the contact plug 14 formed therein. The conductive material 15A for a lower electrode serves to form a lower electrode 15 (See, FIG. 1D) as described below. The conductive material 15A for a lower electrode may include a metallic material, for example, tantalum (Ta).

Figure 1B:
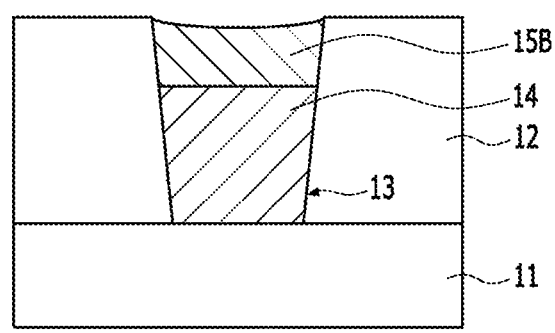

As shown in FIG. 1B, a first planarization process may be performed in the conductive material 15A for a lower electrode (See, FIG. 1A). The first planarization process may be performed until a top surface of the interlayer dielectric layer 12 is exposed. The first planarization process may be performed as a CMP (Chemical Mechanical Polishing) process by using a slurry having a polishing rate for the conductive material 15A for a lower electrode higher than a polishing rate for the interlayer dielectric layer 12. As such, a conductive material 15B for a lower electrode may be formed in the contact hole 13 separately from the neighboring contact hole 13.

However, due to a difference in polishing rates between the conductive material 15A for a lower electrode and the interlayer dielectric layer 12, a dishing problem may occur. The dishing refers to that the conductive material 15B for a lower electrode in which the first planarization process has been completed has a different height according to a position in the contact hole 13. That is, a height of the conductive material 15B for a lower electrode may be decreased in a direction from a portion adjacent to the interlayer dielectric layer 12 having a low polishing rate to a center portion of the contact hole 13. Such dishing may cause flexure of the MTJ structure to be formed in a subsequent processes, and thus various characteristics of the variable resistance element may be deteriorated.

Figure 1C:
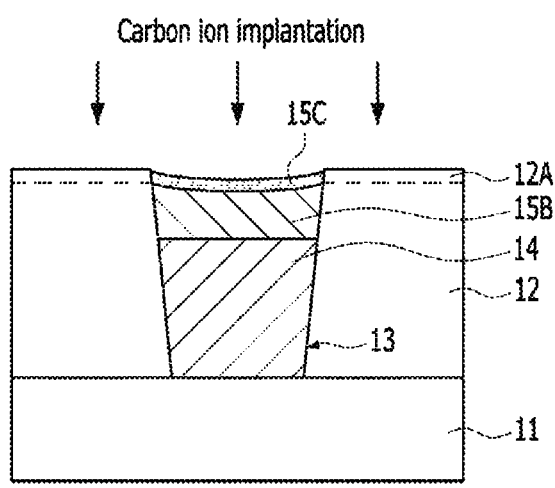

As shown in FIG. 1C, a carbon ion implantation process may be performed in the conductive material 15B for a lower electrode. Through the carbon ion implantation, a carbon-containing conductive layer 15C may be formed over a portion of the conductive material 15B for a lower electrode, that is, over a top surface of the conductive material 15B for a lower electrode.

The carbon ion implantation process may be performed at a dose and an energy allowing the conductive material 15B for a lower electrode to become the carbon-containing conductive layer 15C through property changes. For example, the carbon ion implantation process may be performed at an energy of about 1 KeV to about 30 KeV and a dose of about $1 \times 10^{13}$ atoms/cm$^3$ to about $1 \times 10^{16}$ atoms/cm$^3$. The energy and dose in the carbon ion implantation may be suitably adjusted according to a thickness of the carbon-containing conductive layer 15C.

In performing the above process, a carbon ion implantation process may be also performed over an upper portion 12A of the interlayer dielectric layer 12. However, since a property or a polishing rate of the interlayer dielectric layer 12 including a dielectric material is not significantly affected by the carbon ion implantation, a polishing rate similar to a polishing rate before the ion implantation may be maintained.

The carbon-containing conductive layer 15C formed by the carbon ion implantation has a specific resistance substantially same as and/or similar to that of a carbon-free conductive layer, however a polishing rate may become significantly different from that of a carbon-free conductive layer due to property changes. For example, when the conductive material 15B for a lower electrode includes tantalum (Ta), the Vickers hardness may be about 850 MPa to about 880 MPa. In this case, when the carbon-containing conductive layer 15C includes tantalum carbide (TaC) by the carbon ion implantation, the Vickers hardness of tantalum carbide may be about 1500 MPa to about 1800 MPa. That is, the Vickers hardness of the carbon-containing conductive layer 15C may be increased about twofold in comparison with the conductive material 15B for a lower electrode.

As a result, if a planarization process is performed under the same condition as that in FIG. 1B, since a polishing rate of the interlayer dielectric layer 12 does not change, the carbon-containing conductive layer 15C may have a polishing rate lower than that of the interlayer dielectric layer 12. That is, contrary to FIG. 1B, the interlayer dielectric layer 12 may be planarized at a polishing rate higher than that of the carbon-containing conductive layer 15C.

Figure 1D:
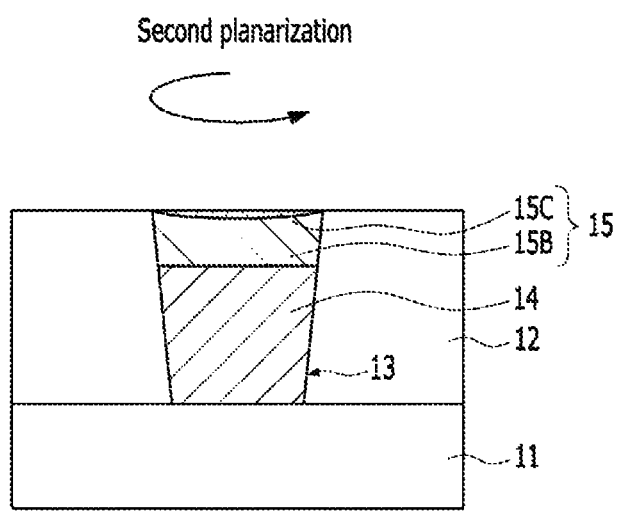

As shown in FIG. 1D, a second planarization process may be performed. The second planarization process may be performed at a height capable of removing the dishing over a surface of the carbon-containing conductive layer 15C and minimizing the topology.

When the second planarization process is performed under the same condition as that of the first planarization process shown in FIG. 1B, since a polishing rate of the carbon-containing conductive layer 15C formed by the carbon ion implantation becomes relatively slow, a result contrary to the first planarization process may be expected. That is, a polishing rate of the carbon-containing conductive layer 15C becomes relatively slower than that of the interlayer dielectric layer 12 so that a portion adjacent to the interlayer dielectric layer 12 may be planarized at a polishing rate higher than that of the carbon-containing conductive layer 15C formed in a center portion of the contact hole 13.

In this process, the carbon ion implantation region in the upper portion 12A of the interlayer dielectric layer may be removed.

Figure 1E:
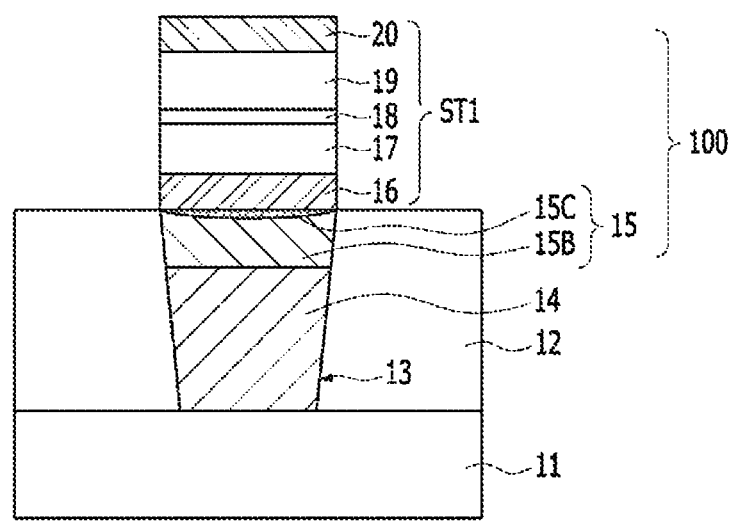

As a result of this process, since the planarization is performed with the presence of the carbon-containing conductive layer 15C and thus is different from the first planarization process, the carbon-containing conductive layer 15C having a planarized surface by removing the dishing may be formed. This planarized surface of the carbon-containing conductive layer 15C provides a relatively flat surface with reduced or minimized dishing for a layered structure to be subsequently formed to have an improved flatness for each layer in the subsequently formed layered structure. The subsequently formed layered structure can in various forms depending on the needs for particular circuitry. In the specific examples disclosed below, this subsequently formed layered structure can include a multilayered variable resistance element for storing data. As illustrated in FIG. 1E, for example, the carbon-containing conductive layer 15C may function as a lower electrode 15 of a variable resistance element 100 described below together with the conductive material 15B for a lower electrode. The lower electrode 15 may be positioned at a bottommost portion of the variable resistance element as a part of the variable resistance element and couple the contact plug 14 with the variable resistance element. In present implementation, since the lower electrode 15 has a planarized surface, flatness of layers disposed over the lower electrode 15, for example, the MTJ structure may be secured.

As shown in FIG. 1E, a stack structure ST1 may be formed over the lower electrode 15, which may include at least an MTJ structure 17, 18 and 19 and overlap with the contact hole 13, thereby being coupled with the lower electrode 15. In present implementation, the stack structure ST1 may include a seed layer 16, the MTJ structure 17, 18 and 19, and a capping layer 20 which are sequentially stacked. The stack structure ST1 may be formed by sequentially forming material layers for the seed layer 16, the MTJ structure 17, 18 and 19, and the capping layer 20 and selectively etching the material layers by using one mask. As a result, the seed layer 16, the MTJ structure 17, 18 and 19, and the capping layer 20 may have sidewalls aligned with each other.

Here, the MTJ structure 17, 18 and 19 may include a free layer 17 including a magnetic material and having a variable magnetization direction, a pinned layer 19 including a magnetic material and having a pinned magnetization direction, and a tunnel barrier layer 18 interposed between the free layer 17 and the pinned layer 19. The vertical positions of the free layer 17 and the pinned layer 19 may be reversed. Since the magnetization direction of the free layer 17 is variable, the free layer 12 may store different data according to its magnetization direction, and be referred to as a storage layer, etc. The pinned layer 19 may be compared with the free layer 17 and be referred to as a reference layer, etc. The free layer 17 and the pinned layer 19 may have a single-layered structure or a multi-layered structure including a ferromagnetic material such an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, etc., and further include an impurity such as boron (B). However, the present disclosure is not limited thereto. In some implementations, the magnetization directions of the free layer 17 and the pinned layer 19 may be substantially perpendicular to a surface of the layer. The tunnel barrier layer 18 may change the magnetization direction of the free layer 17 by tunneling of electrons. The tunnel barrier layer 18 may have a single-layered structure or a multi-layered structure including oxide, such as $Al_2O_3$, MgO, CaO, SrO, TiO, VO, NbO, etc. Other materials may also be used in the tunnel barrier layer 18.

The seed layer 16 may serve to help the layer disposed over the seed layer 16, for example, the free layer 17 in growing in a desired crystalline structure and be formed of a metallic material such as Ru, Ta, etc.

The capping layer 20 may serve to separate the magnetic material from a material disposed over the magnetic material by covering a top surface of the pinned layer 19 and function as a hard mask in a etch process for forming the variable resistance element 100. The capping layer 20 may be formed of a nonmagnetic conductive material, for example, a metallic material such as Ru, Ta, etc.

However, the stack structure ST1 is not limited to that shown in the drawing and may have various multi-layered structure, provided that it includes the MTJ structure 17, 18 and 19.

The semiconductor device shown in FIG. 1E may be fabricated by the process described above.

Referring to FIG. 1E again, the semiconductor device in accordance with the implementation of the present disclosure may include the stack structure ST1 which includes the substrate 11 having a lower structure (not shown) as needed, the interlayer dielectric layer 12 having a contact hole 13 formed over the substrate 11 and exposing a portion of the substrate, the contact plug 14 filling a bottom of the contact hole 13 and coupled with the substrate 11, the lower electrode 15 formed over the contact plug 14, and the stack structure ST1 coupled with the lower electrode 15 over the lower electrode 15 and including at least the MTJ structure 17, 18 and 19. The lower electrode 15 and the stack structure ST1 may be integrated to form the variable resistance element 100. That is, in present implementation, the lower electrode 15 corresponding to a bottommost portion of the variable resistance element 100 may have a shape filled in the interlayer dielectric layer 12.

Here, the lower electrode 15 may have a stack structure of the conductive material 15B for a lower electrode and the carbon-containing conductive layer 15C.

The carbon-containing conductive layer 15C has a bottom surface of which a center portion is dent compared to an edge. Also, the carbon-containing conductive layer 15C has a top surface which is substantially flat and located at a substantially same level as a top surface of the interlayer dielectric layer 12.

As such, in accordance with present implementation, the lower electrode 15 having a planarized surface with the minimized topology may be formed by performing the planarization process two times and performing the carbon ion implantation process for property changes between the planarization processes in case of forming the lower electrode 15. As a result, it is possible to secure the flatness of the stack structure ST1 formed over the lower electrode 15, and thus prevent deterioration of properties of the variable resistance element.

FIGS. 2A to 2E are cross-sectional views explaining a semiconductor device and a method for fabricating the same in accordance with another implementation of the present disclosure. Differences from the implementation described above will be mainly explained.

Figure 2A:
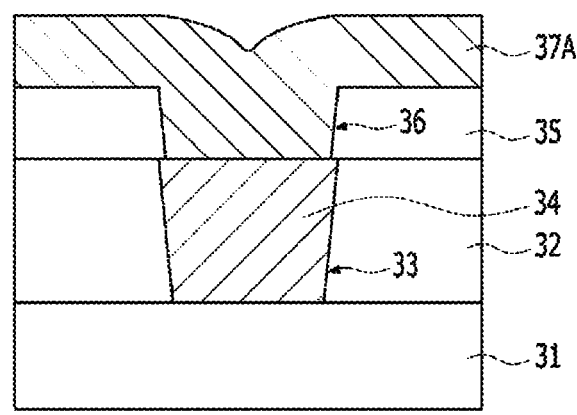
FIGS. 2A to 2E are cross-sectional views explaining a semiconductor device and a method for fabricating the same in accordance with another implementation of the present disclosure.

As shown in FIG. 2A, a first interlayer dielectric layer 32 having a first contact hole 33 may be formed over a substrate 31 and then a contact plug 34 may be formed to fill the contact plug 34. The contact plug 34 may be formed by forming a conductive material at a thickness capable of sufficiently filling the first contact hole 33 over a resultant structure having the first contact hole 33 formed therein, and then performing a planarization process until a top surface of the first interlayer dielectric layer 32 is exposed.

Next, a second contact hole 35 overlapping with the first contact hole 33 and exposing a portion of the contact plug 34 may be formed by forming a second interlayer dielectric layer 35 over the first interlayer dielectric layer 32 and the contact plug 34 and selectively etching the second interlayer dielectric layer 35.

Subsequently, a conductive material 36A for a lower electrode filling the second contact hole 35 may be formed. The conductive material 36A for a lower electrode may be formed of a conductive material at a thickness capable of sufficiently filling the second contact hole 35.

Figure 2B:
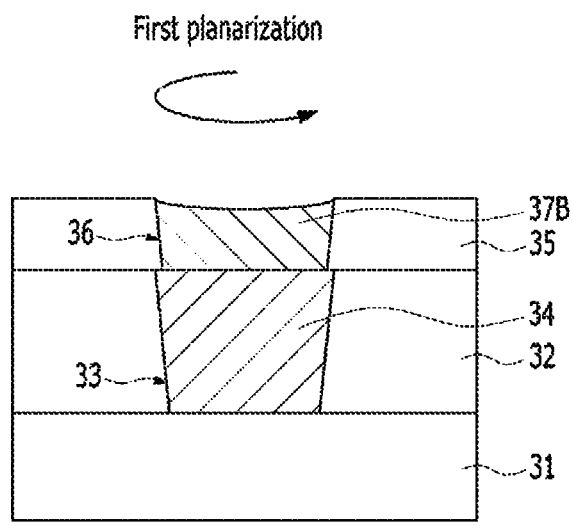

As shown in FIG. 2B, a first planarization process may be performed. The first planarization process may be performed so as to expose a top surface of the second interlayer dielectric layer 35. The first planarization process may be performed by a chemical mechanical polishing process under the condition that a polishing rate of the conductive material 36A for a lower electrode is higher than that of the first interlayer dielectric layer 35. As a result, a conductive material 36B for a lower electrode may be formed in the second contact hole 35 separately from the neighboring second contact hole 35.

Figure 2C:
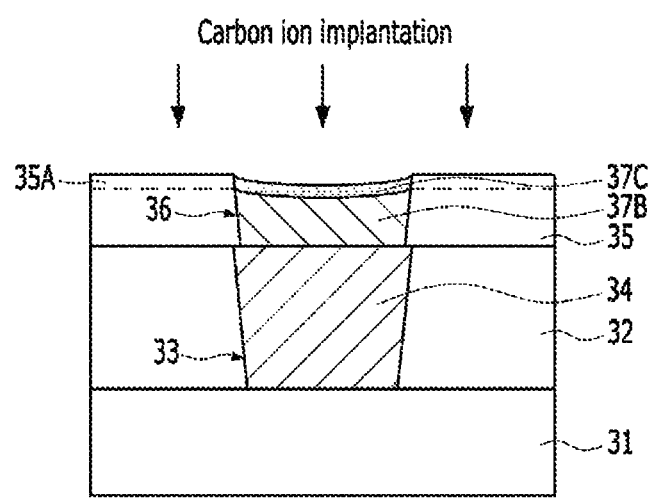

As shown in FIG. 2C, a carbon ion implantation may be performed in the conductive material 36B for a lower electrode. Through the carbon ion implantation, a carbon-containing conductive layer 36C may be formed over a portion, that is, a top surface of the conductive material 36B for a lower electrode.

Figure 2D:
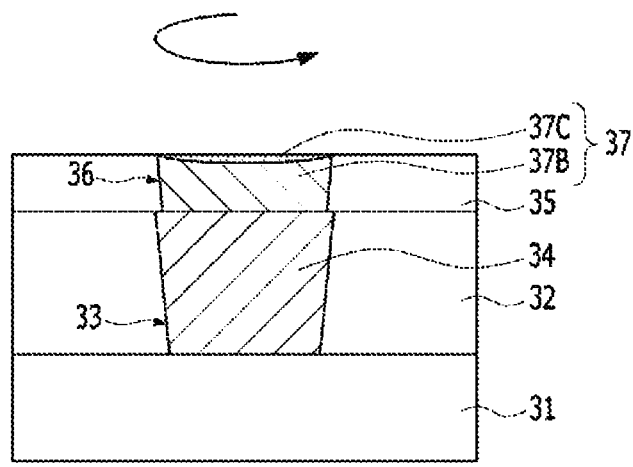

As shown in FIG. 2D, a second planarization process may be performed. The second planarization process may be performed at a height capable of removing the dishing over a surface of the carbon-containing conductive layer 36C and minimizing the topology.

As a result of this process, since the polishing is performed contrary to the first planarization process, the carbon-containing conductive layer 36C having a planarized surface may be formed by removing the dishing. The carbon-containing conductive layer 15C may function as a lower electrode 36 of the variable resistance element 200 described below together with the conductive material 36B for a lower electrode.

Figure 2E:
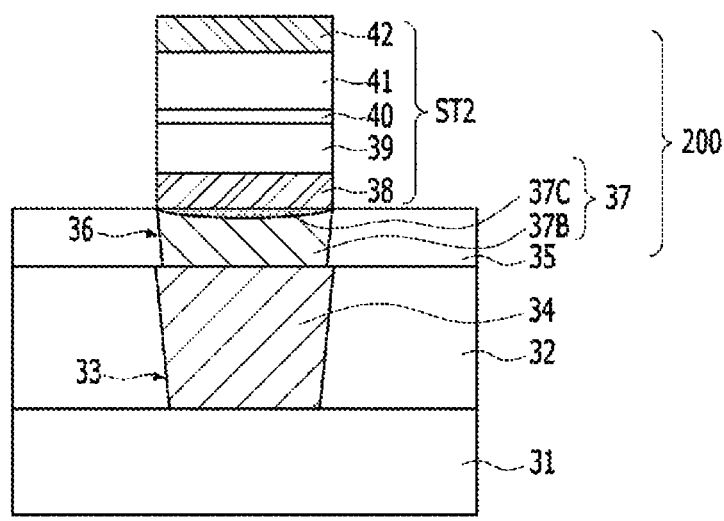

As shown in FIG. 2E, a stack structure ST2 including at least an MTJ structure 38, 39 and 40 may be formed over the lower electrode 36.

In accordance with present implementation, although the lower electrode 36 coupled with the contact plug 34 may be positioned over the contact plug 34 contrary to the implementation described above, sidewalls of the contact plug 34 and the lower electrode 36 may not be aligned with each other.

According to the electronic device including the semiconductor memory and the method for fabricating the same in accordance with the implementation described above, characteristics of the variable resistance element may be secured and process difficulties may be reduced.

The above and other memory circuits or semiconductor devices based on the disclosed technology can be used in a range of devices or systems. FIGS. 3-7 provide some examples of devices or systems that can implement the memory circuits disclosed herein.

Figure 3:
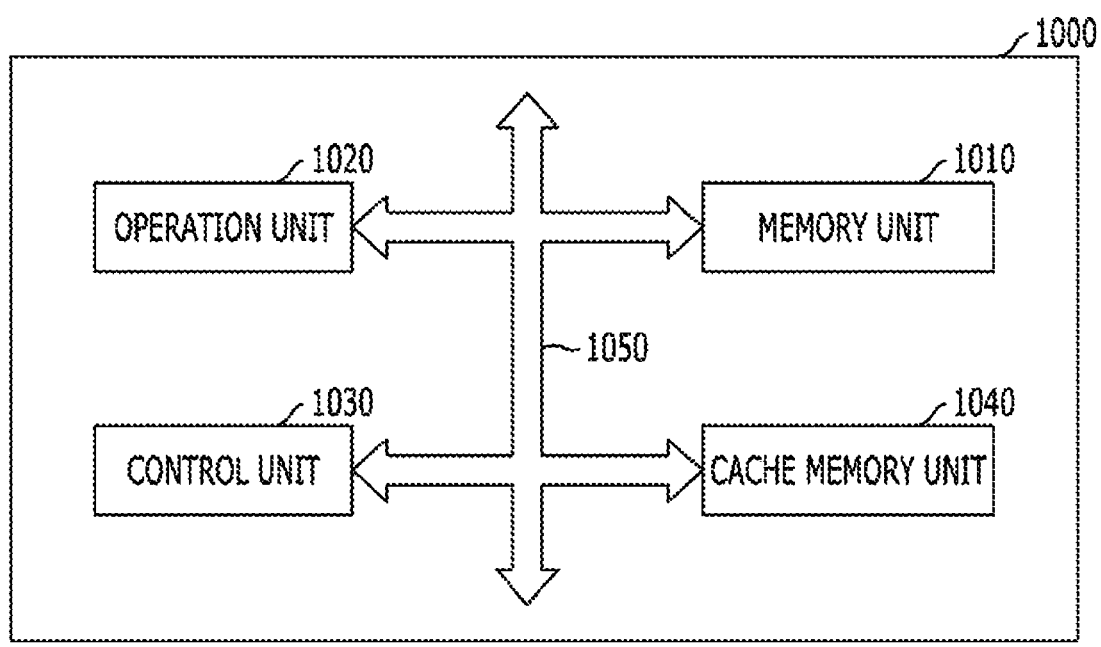
FIG. 3 is an example of configuration diagram of a microprocessor implementing memory circuitry based on the disclosed technology.

FIG. 3 is an example of configuration diagram of a microprocessor implementing memory circuitry based on the disclosed technology.

Referring to FIG. 3, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an interlayer dielectric layer having a hole; a conductive pattern filled in the hole; and a variable resistance element coupled with the conductive pattern over the conductive pattern and storing different data according to a resistance change, wherein the conductive pattern includes a carbon-containing conductive layer in a region adjacent to the variable resistance element. Through this, data storage characteristics of the memory unit 1010 may be improved and fabricating processes may be easy. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 4:
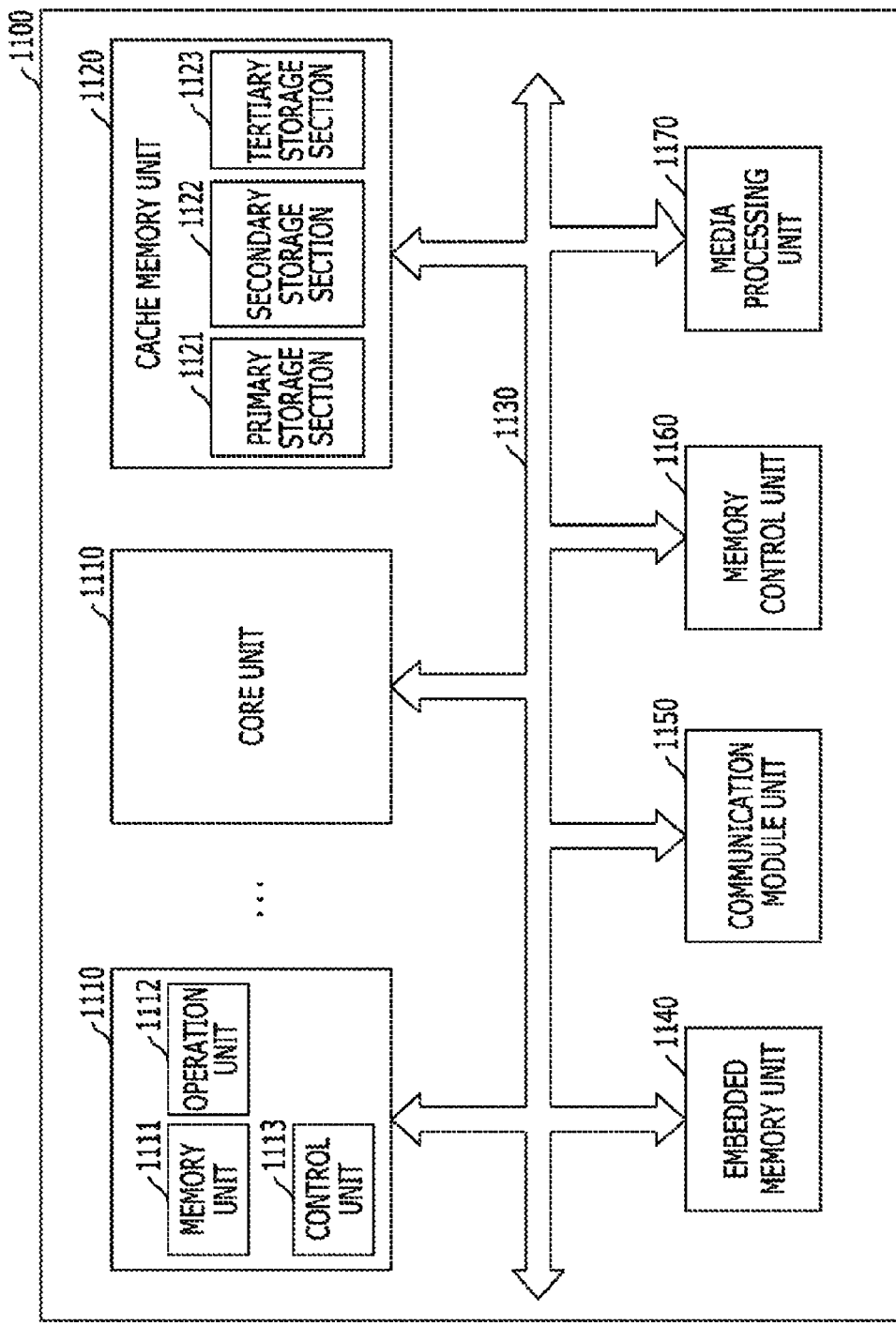
FIG. 4 is an example of configuration diagram of a processor implementing memory circuitry based on the disclosed technology.

FIG. 4 is an example of configuration diagram of a processor implementing memory circuitry based on the disclosed technology.

Referring to FIG. 4, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an interlayer dielectric layer having a hole; a conductive pattern filled in the hole; and a variable resistance element coupled with the conductive pattern over the conductive pattern and storing different data according to a resistance change, wherein the conductive pattern includes a carbon-containing conductive layer in a region adjacent to the variable resistance element. Through this, data storage characteristics of the cache memory unit 1120 may be improved and fabricating processes may be easy. As a consequence, operating characteristics of the processor 1100 may be improved.

Although it was shown in FIG. 4 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 5:
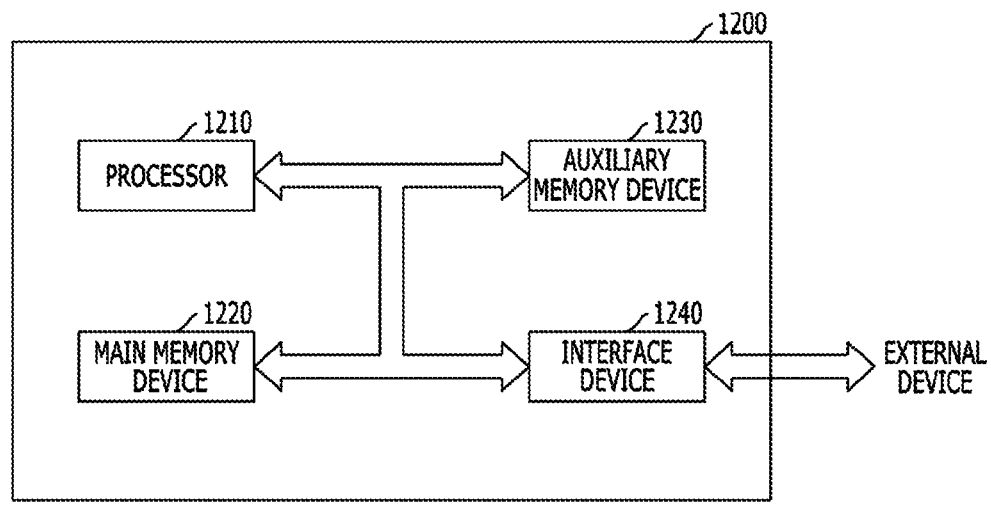
FIG. 5 is an example of configuration diagram of a system implementing memory circuitry based on the disclosed technology.

FIG. 5 is an example of configuration diagram of a system implementing memory circuitry based on the disclosed technology.

Referring to FIG. 5, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an interlayer dielectric layer having a hole; a conductive pattern filled in the hole; and a variable resistance element coupled with the conductive pattern over the conductive pattern and storing different data according to a resistance change, wherein the conductive pattern includes a carbon-containing conductive layer in a region adjacent to the variable resistance element. Through this, data storage characteristics of the main memory device 1220 may be improved and fabricating processes may be easy. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an interlayer dielectric layer having a hole; a conductive pattern filled in the hole; and a variable resistance element coupled with the conductive pattern over the conductive pattern and storing different data according to a resistance change, wherein the conductive pattern includes a carbon-containing conductive layer in a region adjacent to the variable resistance element. Through this, data storage characteristics of the auxiliary memory device 1230 may be improved and fabricating processes may be easy. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 6:
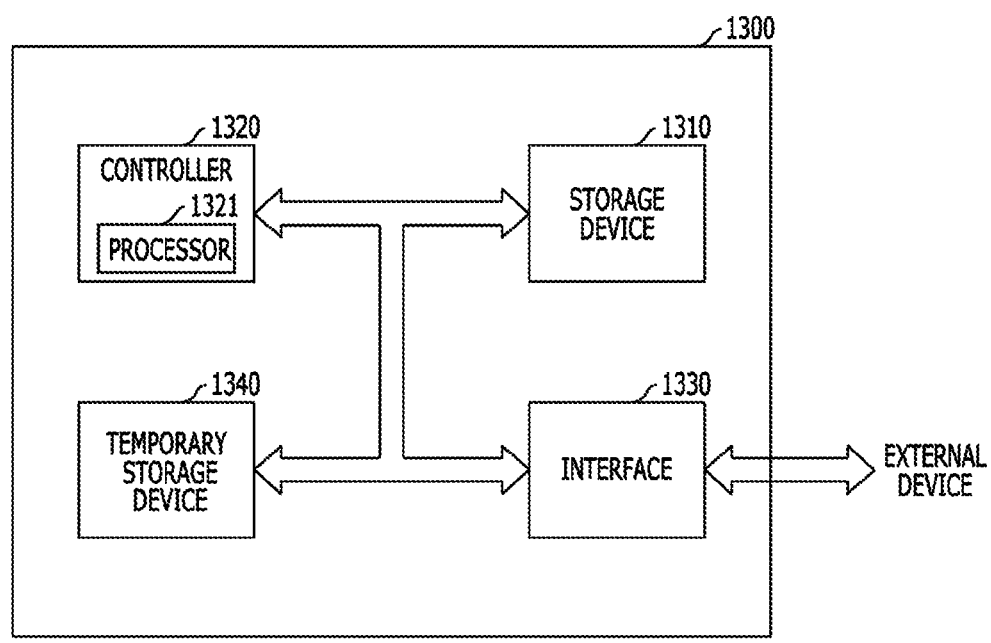
FIG. 6 is an example of configuration diagram of a data storage system implementing memory circuitry based on the disclosed technology.

FIG. 6 is an example of configuration diagram of a data storage system implementing memory circuitry based on the disclosed technology.

Referring to FIG. 6, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an interlayer dielectric layer having a hole; a conductive pattern filled in the hole; and a variable resistance element coupled with the conductive pattern over the conductive pattern and storing different data according to a resistance change, wherein the conductive pattern includes a carbon-containing conductive layer in a region adjacent to the variable resistance element.

Through this, data storage characteristics of the storage device 1310 or the temporary storage device 1340 may be improved and fabricating processes may be easy. As a consequence, operating characteristics and data storage characteristics of the data storage system 1300 may be improved.

Figure 7:
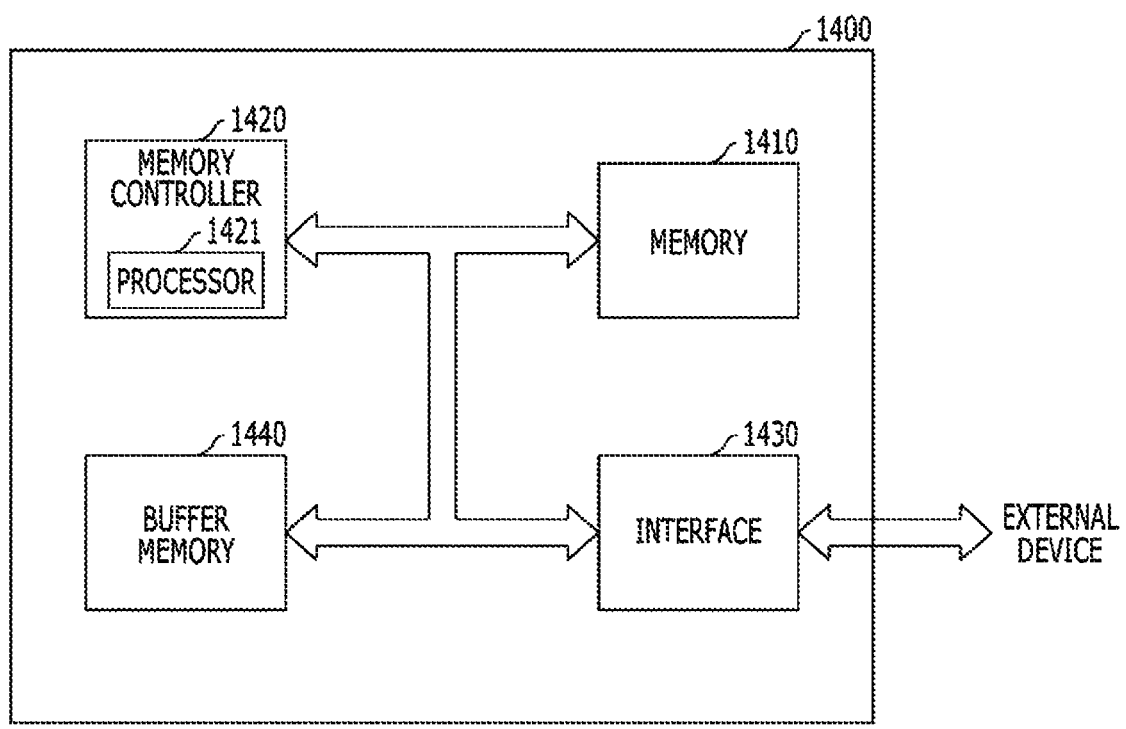
FIG. 7 is an example of configuration diagram of a memory system implementing memory circuitry based on the disclosed technology.

FIG. 7 is an example of configuration diagram of a memory system implementing memory circuitry based on the disclosed technology.

Referring to FIG. 7, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an interlayer dielectric layer having a hole; a conductive pattern filled in the hole; and a variable resistance element coupled with the conductive pattern over the conductive pattern and storing different data according to a resistance change, wherein the conductive pattern includes a carbon-containing conductive layer in a region adjacent to the variable resistance element. Through this, data storage characteristics of the memory 1410 may be improved and fabricating processes may be easy. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an interlayer dielectric layer having a hole; a conductive pattern filled in the hole; and a variable resistance element coupled with the conductive pattern over the conductive pattern and storing different data according to a resistance change, wherein the conductive pattern includes a carbon-containing conductive layer in a region adjacent to the variable resistance element. Through this, data storage characteristics of the buffer memory 1440 may be improved and fabricating processes may be easy. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 3-7 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
    an interlayer dielectric layer having a hole;
    a conductive pattern filled in the hole; and
    a variable resistance element coupled with the conductive pattern over the conductive pattern and storing different data according to a resistance change,
    wherein the conductive pattern includes a carbon-containing conductive layer in a region adjacent to the variable resistance element.

2. The electronic device of claim 1, wherein the variable resistance element includes an MTJ (Magnetic Tunnel Junction) structure which includes a free layer having a variable magnetization direction, a pinned layer having a pinned magnetization direction and a tunnel barrier layer interposed between the free layer and the pinned layer.

3. The electronic device of claim 1, wherein the carbon-containing conductive layer includes a carbon-containing metal layer.

4. The electronic device of claim 1, wherein the carbon-containing conductive layer includes tantalum carbide.

5. The electronic device of claim 1, wherein the variable resistance element includes an MTJ (Magnetic Tunnel Junction) structure which includes a free layer having a variable magnetization direction, a pinned layer having a pinned magnetization direction and a tunnel barrier layer interposed between the free layer and the pinned layer.

6. The electronic device of claim 1, wherein the conductive pattern includes a first conductive material, and the carbon-containing conductive layer includes the first conductive material and carbon.

7. The electronic device of claim 6, wherein the first conductive material has a specific resistance substantially same as that of the carbon-containing conductive layer.

8. The electronic device of claim 6, wherein the first conductive material has Vickers hardness smaller than that of the carbon-containing conductive layer.

9. The electronic device of claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

10. The electronic device of claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

11. The electronic device of claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory is part of the auxiliary memory device or the main memory device in the processing system.

12. The electronic device of claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory is part of the storage device or the temporary storage device in the data storage system.

13. The electronic device of claim 1, further comprising a memory system which includes:
    a memory configured to store data and conserve stored data regardless of power supply;
    a memory controller configured to control input and output of data to and from the memory according to a command inputted form an outside;
    a buffer memory configured to buffer data exchanged between the memory and the outside; and
    an interface configured to perform communication between at least one of the memory, the memory controller and the buffer memory and the outside,
    wherein the semiconductor memory is part of the memory or the buffer memory in the memory system.

14. An electronic device comprising a semiconductor memory, wherein the semiconductor memory includes:
    an interlayer dielectric layer having a hole;
    a conductive pattern filled in the hole; and
    a variable resistance element coupled with the conductive pattern over the conductive pattern and storing different data according to a resistance change,
    wherein the conductive pattern includes a carbon-containing conductive layer in a region adjacent to the variable resistance element, wherein the conductive pattern includes a first conductive pattern, a second conductive pattern formed over the first conductive pattern, and the carbon-containing conductive layer formed over the second conductive pattern.

15. The electronic device of claim 14, wherein the hole includes a first hole, and a second hole positioned over the first hole and having sidewalls which are not aligned with the first hole, wherein the first conductive pattern is filled in the first hole, and wherein the second conductive pattern and the carbon-containing conductive layer are filled in the second hole.

16. An electronic device comprising a semiconductor memory, wherein the semiconductor memory includes:

an interlayer dielectric layer having a hole;
a conductive pattern filled in the hole; and
a variable resistance element coupled with the conductive pattern over the conductive pattern and storing different data according to a resistance change,
wherein the conductive pattern includes a carbon-containing conductive layer in a region adjacent to the variable resistance element, wherein the carbon-containing conductive layer has a bottom surface of which a center portion is dent compared to an edge.

17. The electronic device of claim 16, wherein the carbon-containing conductive layer has a top surface which is substantially flat and located at a substantially same level as a top surface of the interlayer dielectric layer.

* * * * *